United States Patent [19]
Bennett et al.

[11] Patent Number: 5,668,818
[45] Date of Patent: Sep. 16, 1997

[54] SYSTEM AND METHOD FOR SCAN CONTROL OF A PROGRAMMABLE FUSE CIRCUIT IN AN INTEGRATED CIRCUIT

[75] Inventors: Michael J. Bennett, Timnath; Robert W. Proulx, Ft. Collins, both of Colo.

[73] Assignee: Hewlett-Packard Co., Palo Alto, Calif.

[21] Appl. No.: 692,736

[22] Filed: Aug. 6, 1996

[51] Int. Cl.[6] .................................................. G06F 11/00
[52] U.S. Cl. ................................. 371/22.31; 371/22.6
[58] Field of Search ........................ 371/22.1, 22.2, 371/22.3, 22.5, 22.6; 395/183.06; 365/200, 201

[56] References Cited

U.S. PATENT DOCUMENTS 5,321,277  6/1994  Sparks et al. ......................... 371/22.3

Primary Examiner—Vincent P. Canney

[57] ABSTRACT

A scan controllable, programmable fuse circuit is provided to enable testing of an integrated circuit in its final configuration before blowing any of the fuses of the programmable fuse circuits. This is achieved by incorporating a scannable latch that is connected to the output of a programmable fuse circuit and is configured for loading the output value of the programmable fuse circuit. The output value is then latched to the output of the scannable latch. Alternatively, a programmed output value can be scanned into the scannable latch and then latched to the output of the scannable latch.

16 Claims, 5 Drawing Sheets

SYSTEM AND METHOD FOR SCAN CONTROL OF A PROGRAMMABLE FUSE CIRCUIT IN AN INTEGRATED CIRCUIT

FIELD OF THE INVENTION

The present invention relates to programmable fuse circuitry, and more particularly, to controlling the output of a programmable fuse circuit with a scannable latch.

BACKGROUND OF THE INVENTION

In the design of integrated circuits containing memory, a certain mount of redundancy is built in so that defects arising during manufacturing of the integrated circuit can be cured by replacing the defective element with a redundant element. The process of replacing the defective elements with redundant elements is referred to as "mapping" whereby the defective element is "mapped out" and the redundant element is "mapped in." Mapping is typically performed by fuse logic circuitry that is controlled by one or more programmable fuse circuits which are programmed to output a logic control signal to the fuse logic circuitry. A programmable fuse circuit is usually programmed by either blowing or not blowing a fuse associated with the programmable fuse circuit.

As an example, a memory bank comprising a plurality of memory elements is a regular structure that is well suited for designing in redundancy, i.e., redundant memory elements. If during manufacturing one of the memory elements in the bank is defective, then the fuse logic circuitry associated with the memory bank can be programmed to map out the defective element and to map in a redundant element. Accordingly, in order to know which memory elements are defective, integrated circuit manufacturers perform various types of test at various points in the manufacturing process. Of particular relevance with regard to the present invention is one such test referred to as a wafer test.

In general, wafer testing is a means of verifying correct operation of an integrated circuit once manufactured and in wafer form.

Thus, once the integrated circuit has been manufactured but before the wafer is cut into individual dies, wafer tests are performed on the integrated circuit in order to determine if the memory is operating properly or if there are defective memory elements therein. If any defective memory elements are located, then the wafer is removed from the wafer tester and is taken to a laser programming station where the programmable fuse circuits are programmed to provide the fuse logic circuitry with an appropriate logic pattern for mapping the memory bank. The programmable fuse circuits are programmed at the laser programming station by a laser that "blows" the fuses associated with selected programmable fuse circuits. Currently, there are no means available for verifying that the laser programming is successful without performing a second wafer test. Therefore, the wafer is then returned to the wafer tester for retesting the integrated circuit in order to confirm the laser programming fixed the defect prior to the final assembly of the integrated circuit. The foregoing process is not only costly and time consuming, but it also requires the integrated circuit to be wafer tested twice, and thereby, increasing the possibility of further damaging the integrated circuit each time the integrated circuit is handled or tested.

Further, memory banks are often a part of an embedded memory circuit, whereby other circuitry in the integrated circuit uses (i.e., depends on) the embedded memory. Consequently, the memory must be fully functionally and configured in its final state in order for complete testing of the other non-memory circuits. If the operation of the memory is not fully configured at the first wafer test, then the other circuits that use the memory cannot be fully tested until the memory has been mapped and second wafer test performed to confirm the fix. Again, this is costly and time consuming.

Another option is to test the memory and the non-memory circuits independently at wafer test, configure the redundant elements of the memory, and then test the final assembly in package form. However, this leaves the interface between the memory and non-memory circuits untested, and therefore, defects may exist that cause the integrated circuit to fail final testing. Thus, the cost of assembling and packaging the integrated circuit is lost if the integrated circuit fails final testing. Another disadvantage to this option is that the non-memory circuits may be impossible to test without the memory being configured. This may cause additional yield loss at final testing.

In addition, once an integrated circuit has been packaged and placed in use, certain physical phenomenons and/or activities may contribute to latent defects. When such defects occur, the integrated circuit is typically viewed as irreparable, and therefore, the integrated circuit (or the product within which it is packaged) must be replaced. Currently, there are no means available for reprogramming the programmable fuse circuits that control the fuse logic circuitry in order to overcome latent defects.

Accordingly, a heretofore unaddressed need exists in industry for a system and method for controlling the output of programmable fuse circuits so as to be able to reprogram the programmable fuse circuits without having to permanently program the programmable fuse circuits.

SUMMARY OF THE INVENTION

The present invention overcomes the inadequacies and deficiencies of the prior art as described herein before and as well known in the industry. The present invention provides for a scannable latch that can be employed within a programmable fuse circuit in order to provide scan control over the output of the programmable fuse circuit. In essence, the scannable latch allows the actual output of the programmable fuse circuit to be loaded in and shifted to the output of the scannable latch where the output value of the programmable fuse circuit can be read, or alternatively, a programmed output value to be scanned in and shifted to the output of the scannable latch where the programmed value can be read. This provides the functionality of being able to test any non-memory circuitry that depends on the memory being fully functional and operational while still at the wafer tester before having to blow any fuses at the laser programming station. In addition, the scannable latches provide the functionality of being able to verify the programming of the fuses by loading the outputs of the programmable fuse circuits after the selected fuses have been blown and scanning them.

Therefore, and in accordance with the invention, the output of a programmable fuse circuit is connected to the input of a scannable latch so that the scannable latch can load the output value of the programmable fuse circuit and then latch the output value to the output of the scannable latch. Alternatively, the scannable latch can scan in an output value and then shift the scanned value to the output of the scannable latch. In a preferred configuration, the foregoing functionality is achieved by a scannable latch implemented in a three-latch design comprising a data latch, a shift register master latch, and a shift register slave latch. The data latch includes a single latch with two inputs (LOAD and WRITE) that can be loaded from the input of the scannable latch or from the shift register slave latch. The shift register master latch and a shift register slave latch are connected in series so as to form a master-slave shift register having two inputs (SCANIN and READ) for controlling the operations of "scanning in" data and "scanning out" data. However, it is noted that any implementation of a suitable scannable latch could be incorporated in the present invention, and that such various implementations would merely be a choice of design. In the preferred embodiment, a plurality of the scannable latches are connected as a parallel-in, parallel-out shift register, as is well known in the industry. Associated with each input of the shift register is a programmable fuse circuit such as the one described below.

The programmable fuse circuit to which the scannable latch is connected may take many forms, but for purposes of disclosing the present invention, a preferred embodiment is described herein though it is understanding that the principles of the present invention are equally applicable to virtually any programmable fuse circuit configuration. In the preferred embodiment disclosed herein, the programmable fuse circuit comprises a load device and a fuse connected in series. The load device is connected to a voltage supply (VDD) and the fuse is connected to ground (GND). Associated with the fuse is an output taken at the connection between the load device and the fuse. The load device is preferably an NWELL resistor or a PMOS FET, though any resistive device can be used. In addition, the fuse is preferably a metal layer which is either conductive or nonconductive depending upon whether it has been blown during programming. Alternatively, a polysilicon or silicide layer could be used in place of the metal layer.

The present invention not only provides a system for scan control of programmable fuse circuits, but also provides several methodologies for scan control of programmable fuses. A first method for verifying programming of the programmable fuse circuit can be generalized in the following steps: connecting a scannable latch to a programmable fuse circuit so that the output of the fuse circuit is connected to the input of the scannable latch; latching the programmed fuse data from the programmable fuse circuit into the scannable latch; and scanning out the programmed fuse data value of the programmable fuse circuit in order to verify the programming of the programmable fuse circuit. A second method for testing non-memory circuits dependent on the memory associated with the programmable fuse circuit can be generalized by the following steps: connecting a scannable latch to a programmable fuse circuit so that the output of the fuse circuit is connected to the input of the scannable latch; scanning an output data value into the scannable latch; and shifting the output data value to the output of the scannable latch in order to test the non-memory circuits dependent on the memory associated with the programmable fuse circuits. This second method also allows for the verification of the proposed programming of the programmable fuse circuit as represented by the output data value.

In addition to the above features, the system and method of the present invention have many advantages, a few of which are delineated hereafter, as examples.

An advantage of the present invention is that it allows the redundancy of a memory block to be programmed into a final configuration at the wafer tester so that circuitry which is dependent upon the memory bank can be fully tested prior to final programming of the fuses at a laser programming station.

Another advantage of the present invention is that it provides for verification of the laser programming of a programmable fuse circuit by scanning out the programmed fuse values.

Another advantage of the present invention is that redundancy in an integrated circuit can be reprogrammed via the scannable latch at any time, even overriding the laser programming.

Other features and advantages of the present invention will become apparent to one with skill in the art upon examination of the following drawings and detailed description. It is intended that all such additional features and advantages be included herein within the scope of the present invention, as is defined by the appended claims.

BRIEF DESCRIPTION OF THE DRAWINGS

The present invention can be better understood with reference to the following drawings. The elements of the drawings are not necessarily to scale, emphasis instead being placed upon clearly illustrating principles of the present invention. Furthermore, like reference numerals designate corresponding parts throughout the several views.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

I. Architecture

Figure 1:
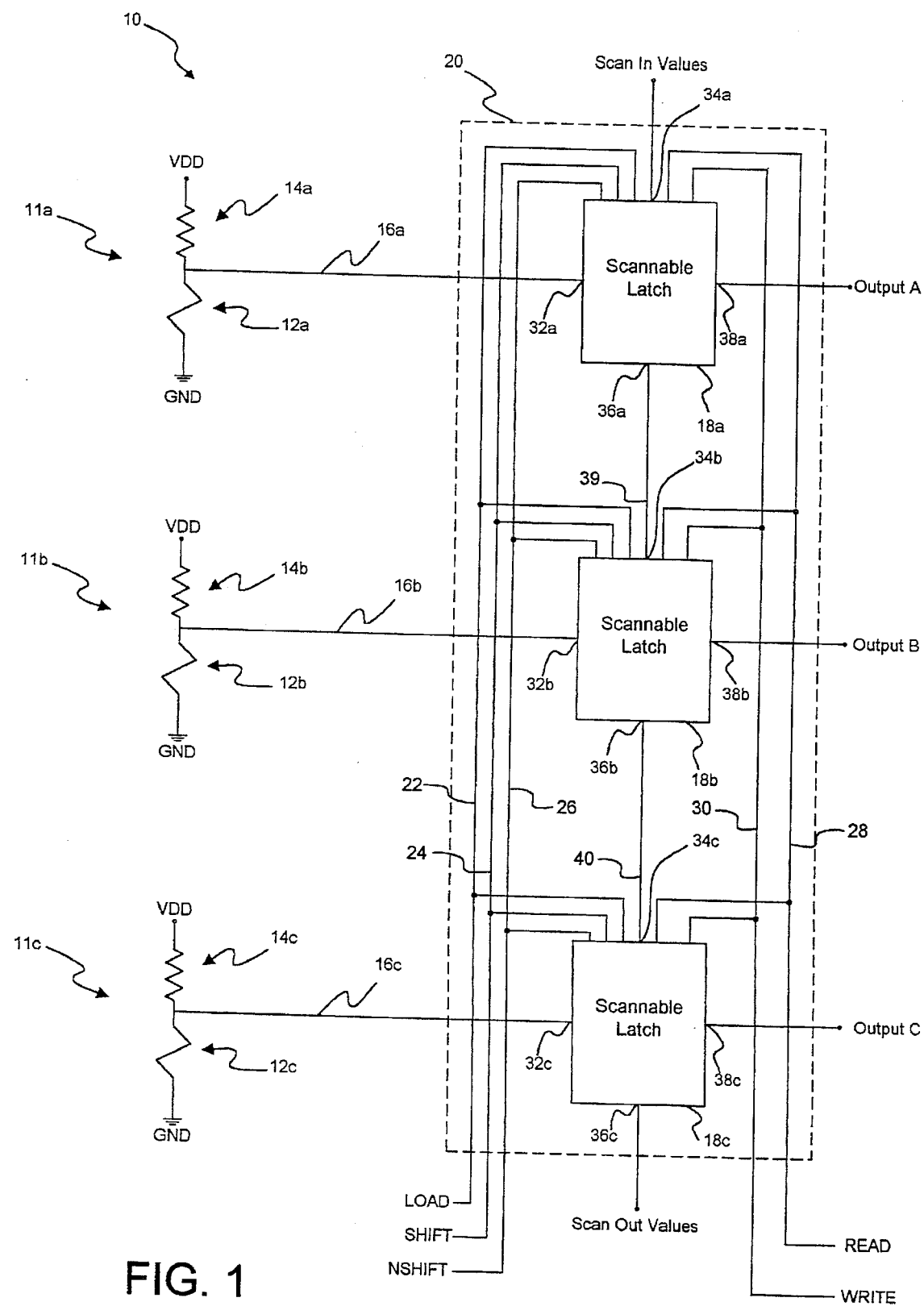
FIG. 1 is a schematic circuit diagram of several programmable fuse circuits configured in parallel with their respective outputs connected to corresponding scannable latches in accordance with the present invention.

With reference to the drawings, FIG. 1 shows a scan controllable, programmable fuse circuit 10 in accordance with the present invention having outputs A, B, and C for connection to fuse logic circuitry (not shown) associated with, for example, a memory bank. Based upon the logic level of outputs A, B, and C, the fuse logic circuitry maps the memory bank so as to remove defective memory elements and replace them with redundant memory elements as described in the Background section.

The scan controllable, programmable fuse circuit 10 comprises a plurality of programmable fuse circuits 11a, 11b, and 11c connected in parallel. Each programmable fuse circuit 11a–11c includes a respective fuse 12a, 12b, and 12c connected in series with a corresponding load device 14a, 14b, and 14c. The load devices 14a–14c are further connected to a voltage supply (VDD) and the fuses 12a–12c are further connected to ground (GND), thereby placing the respective programmable fuse circuits in a parallel configuration. An output is taken from each programmable fuse circuit 11a–11c via respective fuse output lines 16a–16c at the connection between the fuse and the load device.

In preferred embodiment, fuses 12a–12c comprise a metal layer that is either conductive or not depending upon whether the fuse has been blown via laser or other programming method. Alternatively, the metal layer of fuses 12a–12c can be replaced with a layer of polysilicon or a layer of silicide. The load devices 14a–14c are implemented in the preferred embodiment as integrated resistors (e.g., NWELL resistors) or PMOS FETs.

Connected to an output line 16a–16c of each programmable fuse 11a–11c is a scannable latch, such as scannable latches 18a, 18b, and 18c, respectively. The scannable latches 18a–18c are substantially identical and are preferably implemented in a three-latch design as described in detail below with reference to FIG. 2. As shown in FIG. 1, the three scannable latches 18a–18c are configured as a shift register 20, commonly referred to as a scanpath. In order to facilitate the operation of the scannable latches 18a–18c as a scanpath, each scannable latch 18a–18c is connected to a LOAD line 22, a SHIFT line 24, an NSHIFT line 26, a READ line 28, and a WRITE line 30. Accordingly, the shift register 20 is able to load data values into the respective scannable latches 18a–18c in parallel and to output the data values from the respective scannable latches 18a–18c in parallel.

The LOAD line 22 is provided for controlling the loading of input values from the respective fuse output lines 16a–16c into a corresponding DATAIN port 32a, 32b, and 32c. The SHIFT line 24 and the NSHIFT line 26 are provided for controlling the scanning of data values into the scannable latches 18a–18c via SCANIN ports 34a, 34b, and 34c, respectively, and the scanning of data values out of the scannable latches 18a–18c via SCANOUT ports 36a, 36b, and 36c, respectively, all in concert. The READ line 28 is provided for taking data values loaded into one of the scannable latches 18a–18c at the corresponding DATAOUT ports 38a, 38b, and 38c, and latching that value into the shift register master latch 44 to facilitate scanning that value out of the scannable latch at a corresponding SCANOUT port 36a–36c. Similarly, the WRITE line 30 is provided for taking a data value scanned into one of the scannable latches 18a–18c at the corresponding SCANOUT ports 36a–36c, and then loading that value to the output of the scannable latch at the corresponding DATAOUT port 38a–38c.

It is further noted that the SCANOUT port 36a of scannable latch 18a is connected to the SCANIN port 34b of scannable latch 18b via a scan line 39, and the SCANOUT port 36b of scannable latch 18b is connected to the SCANIN port 34c of scannable latch 18c via a scan line 40. Consequently, a data value can be scanned into scannable latch 18a and then scanned out into scannable latch 18b, and so forth and so on.

Figure 2:
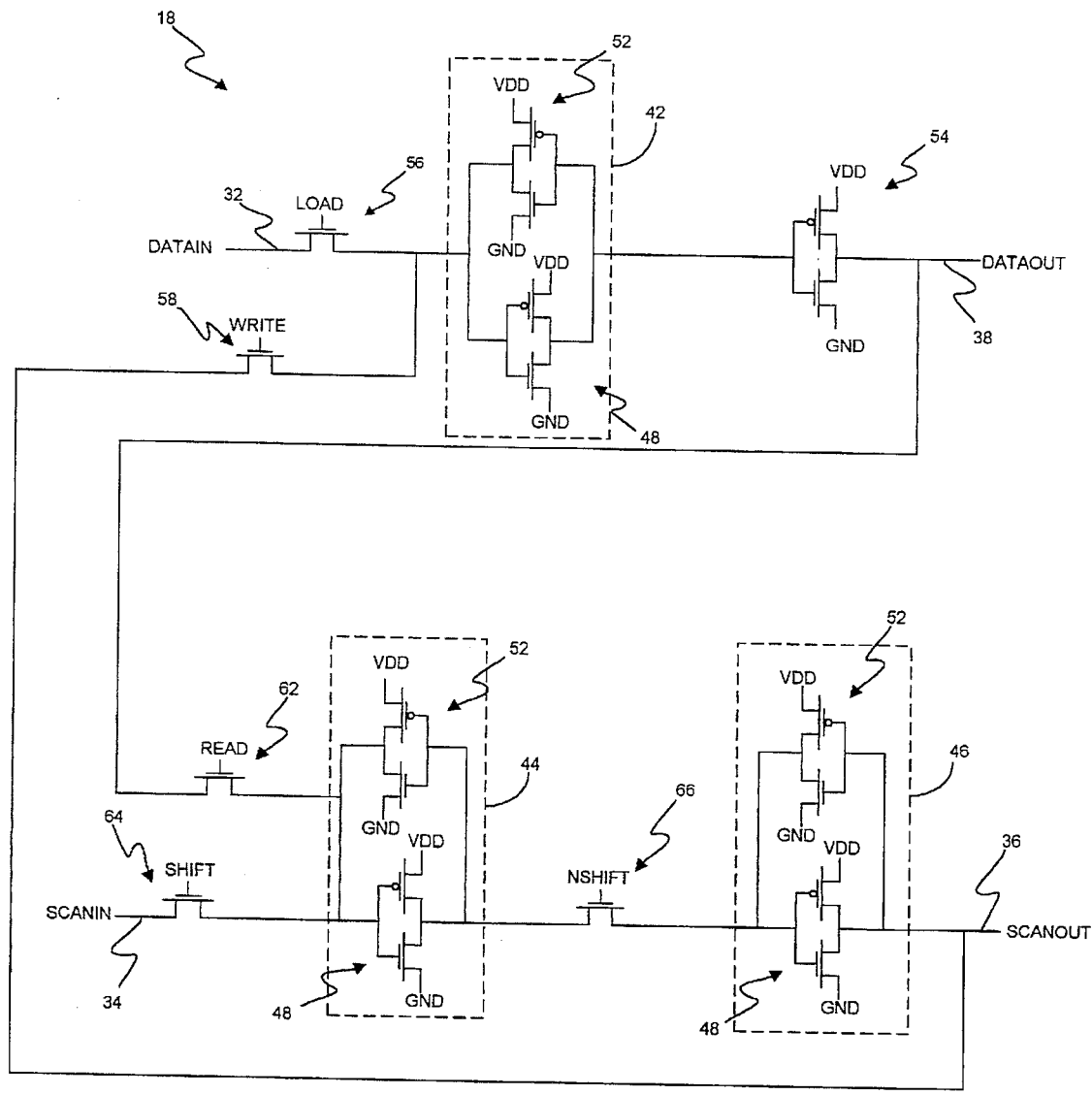
FIG. 2 is a schematic circuit diagram of an illustrative implementation of a scannable latch in accordance with the present invention.

With reference now to FIG. 2, shown is an illustrative implementation for a scannable latch 18 in accordance with the present invention, and suitable for utilization as scannable latches 18a–18c. It should be noted, however, that one of ordinary skill in the art would recognize that there are many different configurations for the scannable latch 18 which would be suitable for operation in accordance with the present invention as scannable latches 18a–18c.

The scannable latch 18 comprises a data latch 42, a shift register master latch 44 and a shift register slave latch 46. Each of the latches 42, 44, and 46 is implemented with a normal forward inverter 48 and a weak feedback inverter 52. The inverters 48 and 52 are preferably two field-effect transistors (FET) configured as shown and as well known in the industry. With regard to the data latch 42, when a load switch 56 is switched on, the input data value from the DATAIN port 32 will overdrive the weak feedback inverter 52. This will drive the forward inverter value to the input data value. The output of the forward inverter 48, that is, the inverse of the input data value, will drive the weak feedback inverter 52 so as to create a positive feedback, and thus, creating a bistable latch. The output of the data latch 42 is then inverted by inverter 54 to provide an even number of inversions, as well as to provide buffering to the output data value at the DATAOUT port 38. It is sometimes desirable to add an inverter (not shown) between the DATAIN port 32 and the load switch 56 to provide input buffering as well.

The data latch 42, as described above, has two inputs controlled by a load switch 56 and a write switch 58. The load switch 56 is connected to the LOAD line 22 and the write switch 58 is connected to the WRITE line 30. By activating the load switch 56 via the LOAD line 22, the data value on the corresponding output line 16 is loaded into the data latch of the scannable latch 18. Alternatively, by activating the write switch 58 via the WRITE line 30, the output data value at SCANOUT port 36 is loaded into the data latch 42.

The shift register master latch 44 likewise has two inputs that are controlled by a read switch 62 and a shift switch 64. The read switch is connected to the READ line 28 and the shift switch is connected to the SHIFT line 24. By activating the read switch 62 via the READ line 28, the data value at the DATAOUT port 38 is loaded into the shift register master latch 44 of the scannable latch 18. Alternatively, by activating the shift switch 64 via the SHIFT line 24, the input data value at SCANIN port 34 is loaded into the shift register master latch 44.

The shift register slave latch 46 has a single input controlled by an nshift switch 66. The nshift switch 66 is connected to the NSHIFT line 26. By activating the nshift switch via NSHIFT line 26, the output of the shift register master latch 44 is latched to the SCANOUT port 36.

II. Operation

A particular functionality associated with the scan controllable, programmable fuse circuit 10 is the ability to provide an output data pattern over outputs A, B, and C to fuse logic circuitry associated with a memory bank. The fuse logic circuitry can then read the output data pattern provided by the scan controllable, programmable fuse circuit 10 and map the memory bank so as to replace defective memory elements with available redundant memory elements. Therefore, an integrated circuit with a defective memory element does not have to be discarded but can be fixed by mapping in the redundant element provided in the design of the integrated circuit.

In operation, once a defective memory element is located via wafer testing, a particular output data pattern for the scan controllable, programmable fuse circuit 10 is determined for mapping of the memory bank to replace the defective memory element with a redundant memory element via the fuse logic circuitry. Traditionally, this output data pattern could only be implemented by blowing the appropriate fuses 12a–12c. As mentioned above, this requires that the wafer to be removed from the wafer tester, taken to a laser programming station for programming, and then taken back to the wafer tester for verification of the mapping operation and additional wafer testing for the non-memory circuits that depend on the memory. This is an inefficient, time consuming, and costly process.

Accordingly, the scan controllable, programmable fuse circuit 10 of the present invention incorporates scannable latches 18a–18c in order to overcome the above-mentioned deficiencies as well as others known in the industry by providing at least the functionality described herein. Particularly, in operation, the scannable latches 18a–18c enable the desired output data pattern to be scanned into the scannable latches 18a–18c and then sent to the associated fuse logic circuitry. This permits wafer testing of the memory and other circuitry in their final configuration without having to blow any fuses. Further, once the output data pattern has been confirmed via wafer testing and the appropriate fuses have been blown at the laser programming station, the laser programming can be verified by scanning out the programmed fuse values.

Figure 3A:
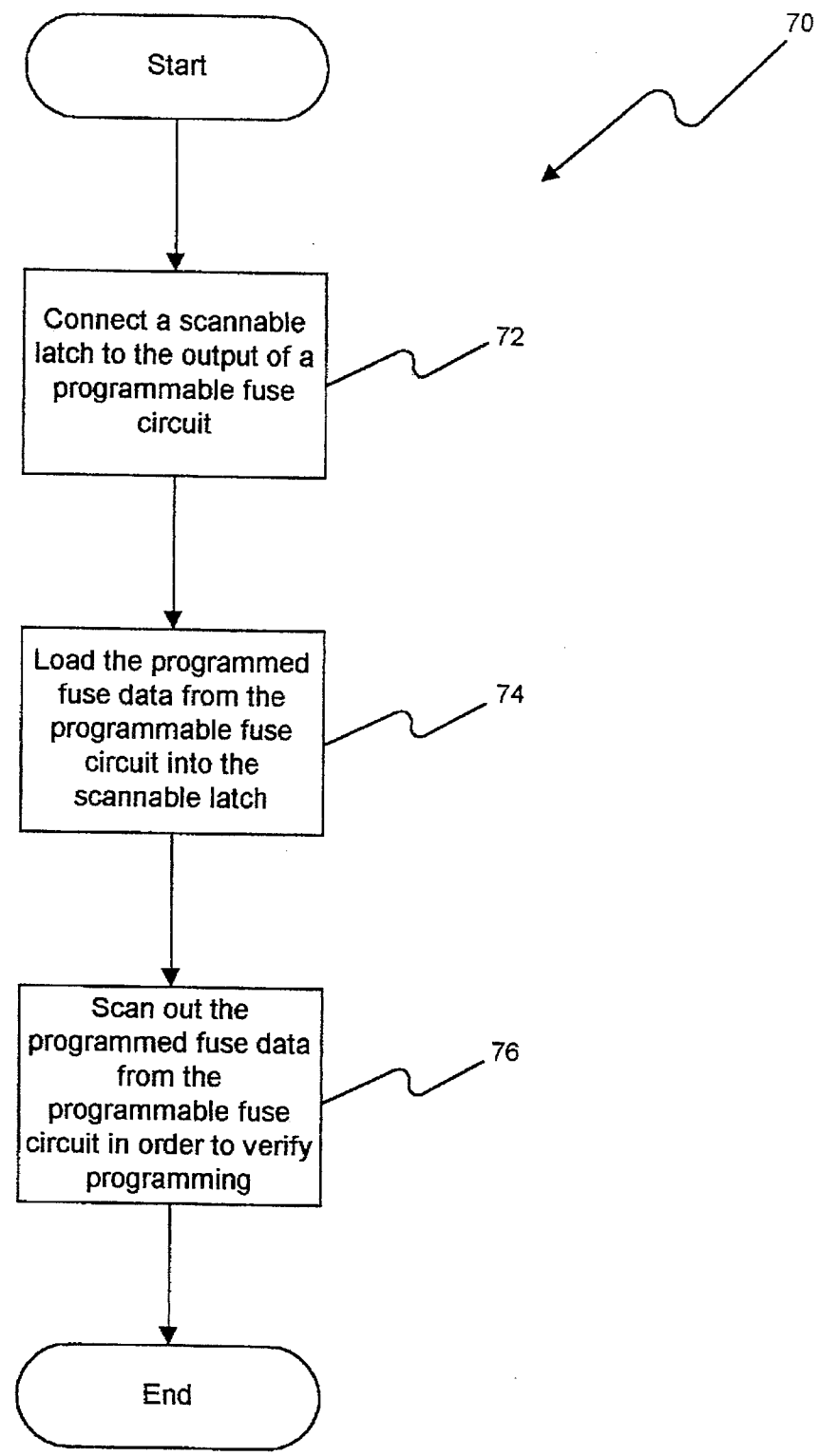
FIGS. 3A and 3B are flowcharts of methods for scan control of a programmable fuse circuit in accordance with the present invention.

Therefore, with reference to FIG. 3A, the present invention provides for a first method 70 for scan control of a programmable fuse circuit in an integrated circuit comprising the following steps. Initially, the scannable latch 18 is fabricated so as to connect to a fuse output of a programmable fuse circuit, as indicated by block 72. At block 74, programmed fuse data from the output of the programmable fuse circuit is loaded into the scannable latch 18. Lastly, the programmed fuse data is scanned out from the scannable latch 18, as indicated by block 76. Accordingly, the programming of the fuse of the programmable fuse circuit can be verified.

Figure 3B:
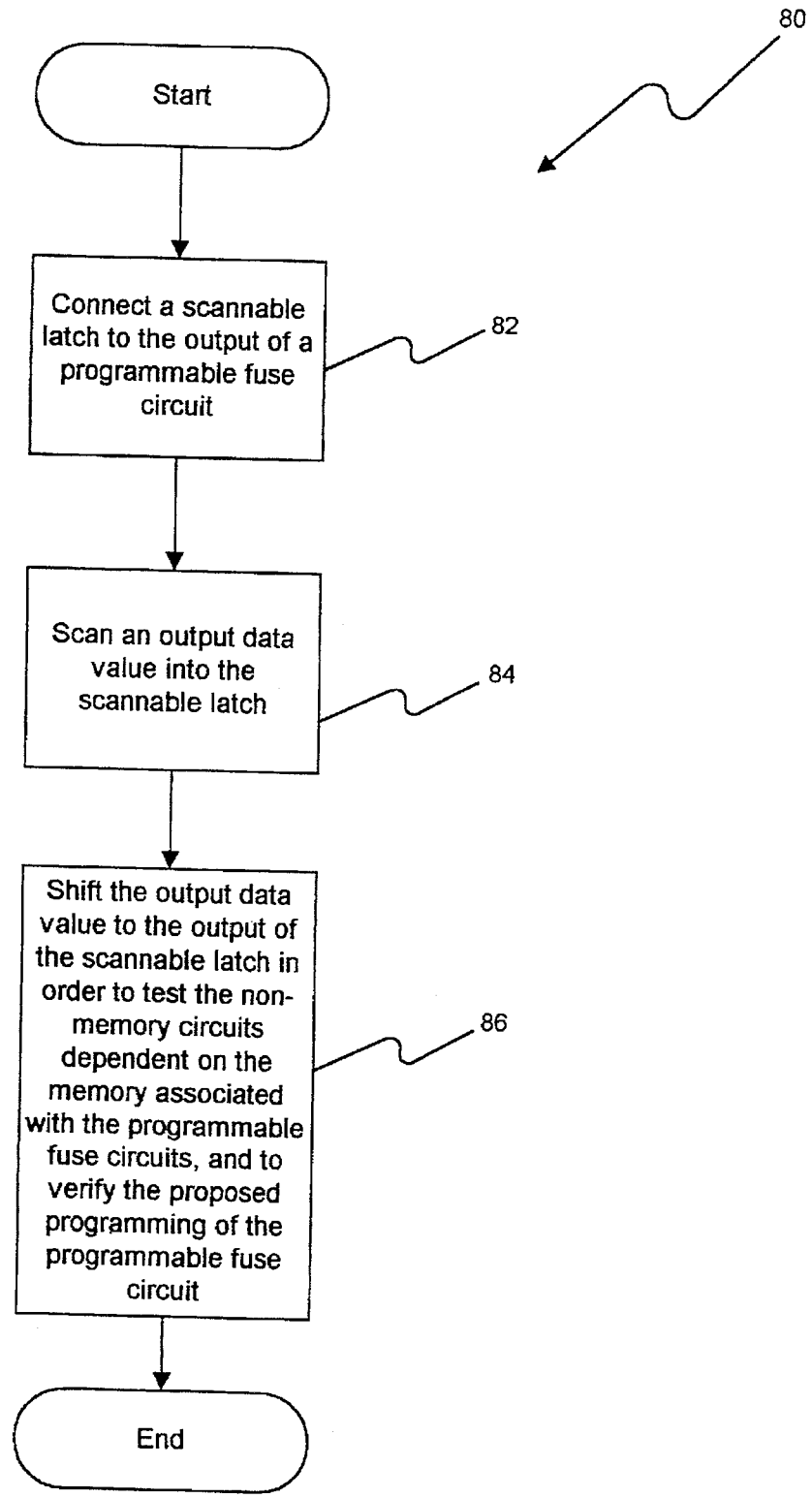

With reference to FIG. 3B, the present invention also provides for a second method 80 for scan control of a programmable fuse circuit in an integrated circuit comprising the following steps. Initially, the scannable latch 18 is fabricated so as to connect to a fuse output of a programmable fuse circuit, as indicated by block 82. Next, at block 84, an output data value of the programmable fuse circuit is scanned into the scannable latch 18. Lastly, the output data value is latched to the DATAOUT port 38 of the scannable latch 18, as indicated in block 86. Accordingly, the non-memory circuits that are dependent on the memory associated with the programmable fuse circuits can be tested without having to actually program (i.e., blow) any fuses. This also allows for verification of the proposed programming of the programmable fuse circuits as represented by the output data value shifted into the scannable latch.

Figure 4:
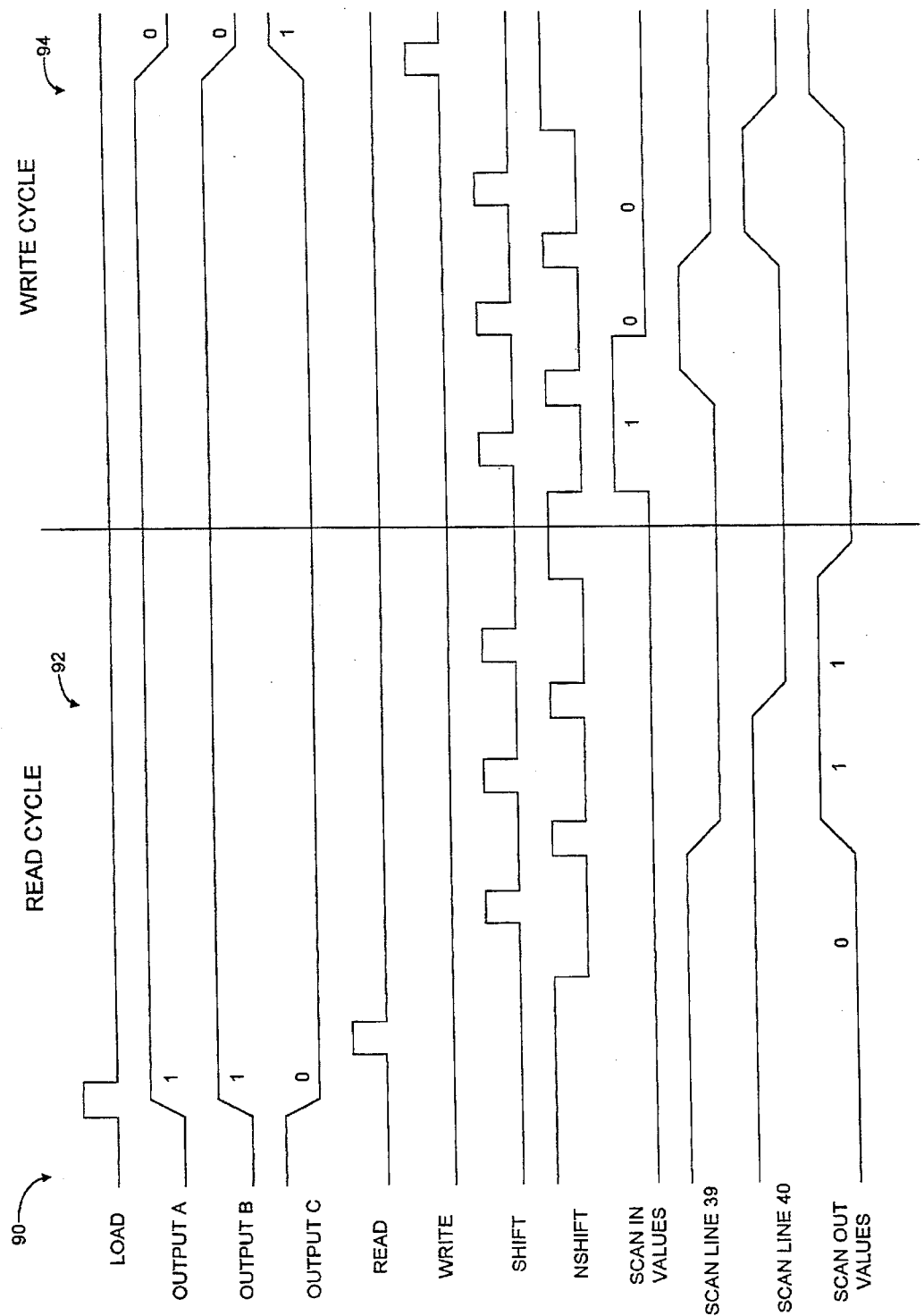
FIG. 4 is a timing diagram for the scannable latch of FIG. 2 during a read cycle and a write cycle.

A timing diagram 90 of the operation of the shift register 20 is provided in FIG. 4 in order to more clearly explain the operation of the scannable latches 18a–18c during a read cycle 92 and a write cycle 94 as required for by the methods 70, 80 described above.

For purposes of the read cycle 92, the fuse 12a and 12b are blown so that the data values on output lines 16a and 16b are a logic high. The fuse 12c is not blown so the data value on the output line 16c is a logic low. In the read cycle 92, the values on output lines 16a–16c are read into the scannable latches 18a–18c and then shifted to the output of the corresponding scannable latch in the following manner. When load switch 56 is activated, the load switch 56 is turned on so that the data value on the output line 16 at DATAIN port 32 is loaded into the data latch 42. This values is transparent through the data latch 42 while signal on the LOAD line 22 is high, and is latched when signal on the LOAD line 22 goes low. This data value propagates through the inverter 54 to the output of the scannable latch 18 at DATAOUT port 38.

When the read switch 62 is activated, the read switch 62 loads the value from the DATAOUT port 38 into the shift register master latch 44. If the nshift switch 66 is also activated, then the data value from the shift register master latch 44 is propagated though the shift register slave latch 46, where it is latched, to the SCANOUT port 36.

A data pattern can also be serially scanned through the scannable latch 18 out to another scannable latch. This is achieved by sequentially activating the shift switch 64 and the nshift switch 66 with the SHIFT line 24 and the NSHIFT line 26, respectively. In the case of the embodiment chosen for illustrating the present invention, where three output data values need to be scanned into or out of the shift register 20, three shift sequences are needed to completely transfer the data values into the respective the scannable latches 18a–18c. For each sequence, the signal on the NSHIFT line 26 goes low, closing nshift switch 66, in preparation for signal on the SHIFT line 24 going high. As the signal on the SHIFT line 24 goes high, the low signal on the NSHIFT line 26 prevents the shift register slave latch 46 from latching the data value from the shift register master latch 44. The signal on the SHIFT line 24 then returns low and the NSHIFT line 26 returns high to propagate the data value through the nshift switch 66 to the shift register slave latch 46. This is an example of a common master-slave latch configuration. The data moves from master to slave in the first stage, from master to slave in the second stage, and so on to subsequent stages.

For purposes of the write cycle 94, the opposite output pattern (i.e., low, low, high) is scanned into the shift register 20 for clarity of the edge transitions. In regard to the write cycle 94, output data values are scanned into the shift register 20 and then loaded to the respective outputs of the scannable latches 18a–18c. This is substantially the reverse operation of the read cycle 92 as discussed above.

Initially, the first data value scanned in is a high value, and therefore, the signal at the SCANIN port 34 is high. Subsequently, the shift switch 64 and the nshift switch 66 are activated in sequence to load the data value into the first scannable latch 18a of the shift register 20. The data value is then latched by the shift register master latch 44, and then into the shift register slave latch 46. The second data value to be scanned in is a low value, and therefore, the signal at the SCANIN port 34 goes low followed by another switching sequence with shift switch 64 and nshift switch 66. This shifts the first data value from the scannable latch 18a to the scannable latch 18b. The scannable latch 18a now contains the second data value scanned into the shift register 20.

The third data value to be scanned in is another low value, and therefore, the signal at the SCANIN port 34 remains low followed by yet another switching sequence with shift switch 64 and nshift switch 66. This shifts the first data value from the scannable latch 18b to the scannable latch 18c and the second data value from the scannable latch 18a to the scannable latch 18b. Scannable latch 18a now contains the third data value scanned into the shift register 20.

The shift register slave latch 46 of each of the scannable latches 18a–18c now contains the desired data values. These data values are then moved to the data latch 42 of each respective scannable latch 18a–18c by activating the write switch 58 via the WRITE line 30. This loads the scanned data values into the respective data latches 42, which propagate through the inverters 54 to the respective outputs A, B, and C, accordingly.

The output pattern of the scan controllable, programmable fuse circuit 10 can then be read by the associated fuse logic circuitry for controlling the mapping of the memory. Thus, the integrated circuit can be more fully tested at the wafer tester without having to remove the wafer for laser programming. This provides the advantage of being able to perform wafer test on the memory and other circuitry dependent on the memory in its final configuration, including the interface between the memory and the other circuitry. This greatly simplifies the diagnosing of a failing chip subsequent to fuse programming, especially if the fuse programming is the problem.

If the programmed output pattern appears to successfully re-map the memory, the wafer can then be taken to a laser programmer (or any other fuse blowing system) where the appropriate fuses 12a–12c are blown. Subsequently, the output values from the respective fuse 12a–12c can be loaded into the respective scannable latches 18a–18c via fuse output lines 16a–16c. This is achieved with the LOAD line 22 as described hereinbefore. This overwrites the output pattern previously scanned into the scannable latches 18a–18c. The programmed values for the fuses can then be verified in order to ensure the laser programming was successful. This can be done as described in the read cycle 92. This is particularly advantageous in that it ensures the quality of the laser programming.

An additional functionality provided by the present invention is that it provides for soft programming or temporary programming capability in regard to the memory. This allows the scan controllable, programmable fuse circuit 10 to re-program around defects from field failures, such as metal migration. If the field failure is associated with an element that can be replaced with a redundant element, such as memory element of a memory bank, the present invention can be used to re-program the fuse logic circuitry so that diagnostic testing can be more thoroughly performed on the integrated circuit.

In concluding the detailed description, it is noted that it would be obvious to one skilled in the art that many variations and modifications may be made to the preferred embodiment without substantially departing from the principles of the current invention. All such variations and modifications are intended to be included herein within the scope of the present invention, as set forth by the following claims. Further, in the claims hereafter, the structures, materials, acts, and equivalence of all means or set plus function elements are intended to include any structures, materials, or acts for performing the recited functions in combination with other claimed elements as specifically claimed.

Wherefore, the following is claimed:

1. A scan controllable, programmable fuse circuit for use in an integrated circuit and having a circuit output, comprising:
   a fuse circuit having a fuse output, said fuse circuit including a fuse that can be blown in order to change a logic level of said fuse output; and
   a scannable latch connected to said fuse output and configured for controlling said circuit output so as to allow output values to be loaded into said scannable latch means from said fuse output and then shifted to said circuit output, and to allow other output values to be scanned into said scannable latch means and then shifted to said circuit output.

2. The scan controllable, programmable fuse circuit of claim 1, wherein said fuse circuit comprises a load device connected in series with said fuse, whereby said fuse output is taken at a connection between said load device and said fuse.

3. The scan controllable, programmable fuse circuit of claim 1, wherein said scannable latch comprises a three-latch design scannable latch.

4. The scan controllable, programmable fuse circuit of claim 1, wherein said scannable latch comprises a master-slave configuration.

5. The scan controllable, programmable fuse circuit of claim 1, further comprising a second fuse circuit having a second fuse output and a second scannable latch connected to said second fuse output, wherein a scan out port of said scannable latch is connected to a scan in port of said second scannable latch.

6. The scan controllable, programmable fuse circuit of claim 5, wherein said scannable latch and said second scannable latch are configured as a shift register.

7. The scan controllable, programmable fuse circuit of claim 5, wherein said shift register includes a read cycle and a write cycle.

8. A method for scan control of a programmable fuse circuit in an integrated circuit, comprising the steps of:
   fabricating a scannable latch connected to a fuse output of a programmable fuse circuit;
   scanning an output value into said scannable latch; and
   shifting said output value to an output of said scannable latch.

9. The method of claim 8, further comprising the step of wafer testing said integrated circuit.

10. The method of claim 8, further comprising the step of loading a second output value from said fuse output and shifting said second output value to said output of said scannable latch.

11. The method of claim 8, further comprising the step of loading a third output value from said fuse output and scanning said third output value out of said scannable latch, this may continue for any number of output values.

12. The method of claim 8, further comprising the step of fabricating a second scannable latch connected to a fuse output of a second programmable fuse circuit.

13. The method of claim 12, further comprising the step of configuring said scannable latch and said second scannable latch as a shift register.

14. A scan controllable, programmable fuse circuit comprising a programmable fuse circuit with a fuse output that is connected to an input of a scannable latch.

15. The scan controllable, programmable fuse circuit of claim 14, wherein said scannable latch comprises a master-slave configuration.

16. The scan controllable, programmable fuse circuit of claim 14, wherein said scannable latch is a part of a shift register.

* * * * *